US010340376B2

(12) United States Patent
Frijlink

(10) Patent No.: US 10,340,376 B2
(45) Date of Patent: Jul. 2, 2019

(54) HETEROJUNCTION FIELD-EFFECT TRANSISTOR HAVING GERMANIUM-DOPED SOURCE AND DRAIN REGIONS

(71) Applicant: OMMIC, Limeil Brevannes (FR)

(72) Inventor: Peter Frijlink, Yerres (FR)

(73) Assignee: OMMIC, Limeil Brevannes (FR)

( * ) Notice: Subject to any disclaimer, the term of this patent is extended or adjusted under 35 U.S.C. 154(b) by 0 days.

(21) Appl. No.: 15/126,027

(22) PCT Filed: Mar. 10, 2015

(86) PCT No.: PCT/FR2015/050600
§ 371 (c)(1),
(2) Date: Sep. 14, 2016

(87) PCT Pub. No.: WO2015/136218
PCT Pub. Date: Sep. 17, 2015

(65) Prior Publication Data
US 2017/0092751 A1 Mar. 30, 2017

(30) Foreign Application Priority Data
Mar. 14, 2014 (FR) ..................... 14 52132

(51) Int. Cl.
*H01L 29/778* (2006.01)
*H01L 29/66* (2006.01)
(Continued)

(52) U.S. Cl.
CPC ...... *H01L 29/7783* (2013.01); *H01L 21/0254* (2013.01); *H01L 21/0262* (2013.01);
(Continued)

(58) Field of Classification Search
CPC ............ H01L 29/7783; H01L 29/0843; H01L 29/2003; H01L 29/207; H01L 29/66462;
(Continued)

(56) References Cited

U.S. PATENT DOCUMENTS

2005/0258451 A1 11/2005 Saxler et al.
2008/0176366 A1 7/2008 Mita et al.
(Continued)

OTHER PUBLICATIONS

Fuch, H. D. et al., "Germanium 70Ge/74Ge isotope heterostructures: An approach to self-diffusion studies," Physical Review B, vol. 51, No. 23, Jun. 15, 1995, pp. 16 817-16 821. (Year: 1995).*
(Continued)

*Primary Examiner* — Michael Jung
(74) *Attorney, Agent, or Firm* — Young & Thompson

(57) ABSTRACT

A process for fabricating a heterojunction field-effect transistor including a semiconductor structure made up of superposed layers, including: providing on a substrate layer (1) a buffer layer (2), a channel layer (3) and a barrier layer (4), the layers being made of materials having hexagonal crystal structures of the $Ga_{(1-p-q)}Al_{(p)}In_{(q)}N$ type; forming an opening in a dielectric masking layer (5) deposited on the barrier layer; growing by high-temperature epitaxy a semiconductor material (6, 6') having a hexagonal crystal structure, namely $Ga_{(1-x'-y')}Al_{(x')}In_{(y')}N$, doped with germanium, on a growth zone defined by the opening formed in the masking layer; and depositing a source or drain contact electrode (15, 16) on the material thus deposited by epitaxy, and a gate electrode (13) in a location outside of the growth zone.

20 Claims, 3 Drawing Sheets

(51) Int. Cl.
   *H01L 29/08*   (2006.01)
   *H01L 29/20*   (2006.01)
   *H01L 29/207*  (2006.01)
   *H01L 21/02*   (2006.01)
   *H01L 29/04*   (2006.01)

(52) U.S. Cl.
   CPC ........ *H01L 21/02609* (2013.01); *H01L 29/04* (2013.01); *H01L 29/0843* (2013.01); *H01L 29/2003* (2013.01); *H01L 29/207* (2013.01); *H01L 29/66462* (2013.01)

(58) Field of Classification Search
   CPC ................ H01L 29/04; H01L 21/0254; H01L 21/02609; H01L 21/0262
   See application file for complete search history.

(56) References Cited

U.S. PATENT DOCUMENTS

| | | | | |
|---|---|---|---|---|
| 2009/0321717 | A1* | 12/2009 | Pillarisetty | ............ H01L 29/201 257/24 |
| 2013/0105863 | A1* | 5/2013 | Lee | ............ H01L 29/42364 257/194 |
| 2014/0209919 | A1* | 7/2014 | Chiu | ............ H01L 29/7787 257/76 |
| 2015/0243773 | A1* | 8/2015 | Basu | ............ H01L 29/205 257/194 |

OTHER PUBLICATIONS

International Search Report, dated Jul. 15, 2015, from corresponding PCT application.

\* cited by examiner

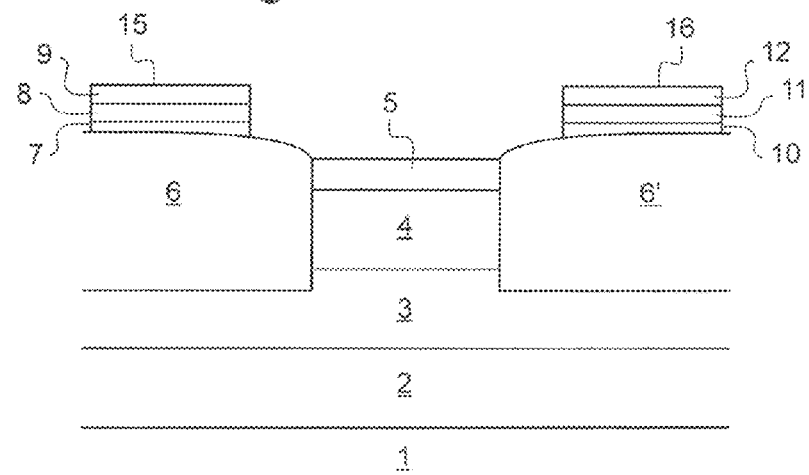
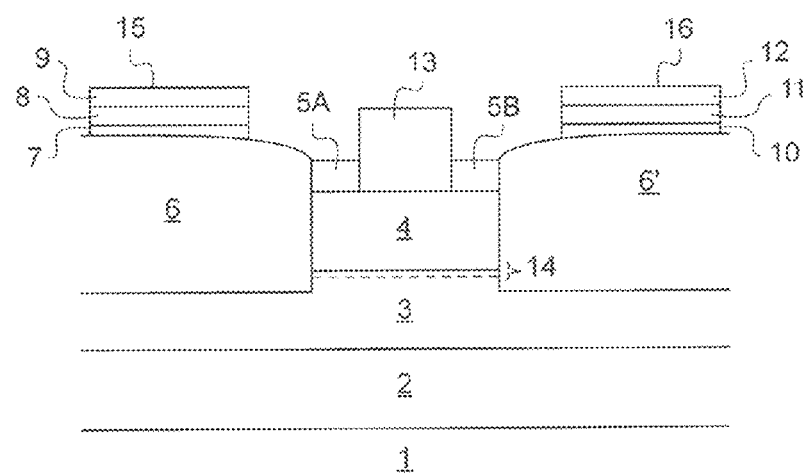

ial layers to

HETEROJUNCTION FIELD-EFFECT TRANSISTOR HAVING GERMANIUM-DOPED SOURCE AND DRAIN REGIONS

BACKGROUND OF THE INVENTION

Field of the Invention

The invention relates to a heterojunction field-effect transistor or high-electron mobility transistor (HEMT) comprising a semiconductor structure made up of superposed layers deposited on a substrate, the superposed layers being composed of semiconductor materials having hexagonal crystal structures, of the $Ga_{(1-p-q)}Al_{(p)}In_{(q)}N$ type, where p and q may be comprised between 0 inclusive and 1 inclusive, the sum p+q being lower than or equal to 1, and the pair {p,q} being specific to each layer. The material of the substrate may for example be GaN, AlN, SiC, Si, diamond or sapphire.

This transistor will possibly be used in a monolithic microwave integrated circuit (MMIC) or in another circuit.

Description of the Related Art

A HEMT (also referred to as a HFET for heterostructure field-effect transistor or a MODFET for modulation-doped field-effect transistor) typically comprises:

a channel layer, made of a first semiconductor material, for example GaN;

a barrier layer on the channel layer, made of a semiconductor material with a wider bandgap than the first material, and a lower electron affinity than the first material, for example AlN or AlGaN;

a gate electrode forming, with the barrier layer, a Schottky junction; and a source electrode and a drain electrode on either side of the gate electrode.

It is known to deposit, in the locations corresponding to the source and drain electrodes, before these electrodes are deposited, a layer of GaN doped with Si atoms by epitaxial growth. This layer of doped GaN makes it possible to design transistors with smaller dimensions. A masking layer is used to define these locations.

The documents K. Shinohara et al, "Electron Velocity Enhancement in Laterally Scaled GaN DH-HEMTs with $f_T$ of 260 GHz", IEEE Electron Device Letters, Vol. 32, No 8, August 2011 and T. Fujiwara, "Low Ohmic Contact Resistance m-Plane AlGaN/GaN Heterojunction Field-Effect Transistors with Enhancement-Mode Operations", Applied Physics Express 3 (2010) describe two examples of processes for fabricating HEMTs on a GaN substrate, comprising steps of localized epitaxial growth of silicon-doped layers.

Document US 2005/0258451, cited in the preliminary search report established for the French patent application the priority of which is claimed here, describes a HEMT obtained by depositing the GaN layer, doped with silicon, germanium or oxygen, inter alia, at a low-enough temperature to prevent mass transport toward the locations corresponding to the drain and source electrodes. Even though the choice of germanium doping is mentioned among other possibilities, a low-temperature is chosen in order to prevent drawbacks related to mass transport in the case of epitaxial deposition of silicon-doped GaN, namely the risk of morphology problems, especially SiN precipitates, nonuniform GaN layer heights and a mediocre reproducibility. Because of the absence of mass transport, the GaN is deposited with a relatively small thickness in order prevent it extending past the dielectric layer.

There is a need for a relatively simple process allowing the definition of the edges of the localized epitaxial layers to be improved.

BRIEF SUMMARY OF THE INVENTION

A process is provided for fabricating a heterojunction field-effect transistor comprising a semiconductor structure made up of superposed layers, the process comprising:

a) providing on a substrate:

a buffer layer composed of a semiconductor material having a hexagonal crystal structure, namely $Ga_{(1-x-y)}Al_{(x)}In_{(y)}N$, where x and y are comprised between 0 inclusive and 1 inclusive, the sum x+y being lower than or equal to 1;

a channel layer on the buffer layer, this channel layer being composed of a material having a hexagonal crystal structure, namely $Ga_{(1-z-w)}Al_{(z)}In_{(w)}N$, where z and w may be comprised between 0 inclusive and 1 inclusive, the sum z+w being lower than or equal to 1, at least one of z and w being different from x or y, respectively; and a barrier layer on this channel layer, this barrier layer being composed of a material having a hexagonal crystal structure, namely $Ga_{(1-z'-w')}Al_{(z')}In_{(w')}N$, where z' and w' may be comprised between 0 inclusive and 1 inclusive, the sum z'+w' being lower than or equal to 1, at least one of z' and w' being different from z or w, respectively;

b) depositing a masking layer made of a dielectric on the barrier layer;

c) forming an opening in the masking layer;

d) growing by high-temperature epitaxy a semiconductor material having a hexagonal crystal structure, namely $Ga_{(1-x'-y')}Al_{(x')}In_{(y')}N$, doped with germanium, where x' and y' are comprised between 0 inclusive and 1 inclusive, the sum x'+y' being lower than or equal to 1, on a growth zone corresponding to the location of the opening formed in the masking layer;

e) depositing a, source or drain, contact electrode on the material deposited by epitaxy in step d); and f) depositing a gate electrode in a location outside of the growth zone.

The expressions "high-temperature" and "high temperature" are understood to mean a temperature that is high enough for the semiconductor material having a hexagonal crystal structure ($Ga_{(1-x'-y')}Al_{(x')}In_{(y')}N$) doped with germanium to be able to migrate toward the growth zone, by mass transport so that step d) is selective. This temperature may for example be comprised between 700° and 1200° C. and it is advantageously strictly higher than 960° C. and lower than or equal to 1150° C., and advantageously between 970° C. and 1150° C.

This process may allow edges to be obtained for the layer of material deposited by epitaxy that are more clear-cut than in the prior art, which may be advantageous in so far as these edges may then serve as alignment marks in additional steps of the fabrication process.

This process may thus allow the gate to be precisely aligned in proximity with the ohmic source contact and/or the ohmic drain contact, thereby allowing lower series resistances to be obtained and the gain of the transistors to be improved.

It has been observed that by applying this process, a product is obtained in which the material doped with germanium has a sufficiently defined crystal structure for the lateral edges of the growth layer thus obtained to be slightly inclined, and therefore relatively distant from the substantially vertical edges of the masking layer. Thus, this process may make it possible to avoid having to protect the dielectric masking layer with another mask before step d), and thus to avoid having to remove this mask after step d), as described in document US 2005/0258451.

Furthermore, with the process described above, the growth material may be deposited so as to form a growth layer that is relatively thick, and especially thicker than the masking layer, without running the risk of making the process longer or more complex. Thus, the masking layer may have a relatively small thickness, for example between 0.1 and 100 nm, advantageously between 0.5 and 10 nm, advantageously between 1 and 7 nm and for example 5 nm.

This process thus allows a heterojunction field-effect transistor to be produced, which transistor comprises a semiconductor structure made up of superposed layers, the semiconductor layers being composed essentially of III-V materials, the atoms from column V of the periodic table being nitrogen atoms, and the atoms from column III of this table being chosen from gallium, aluminium and indium.

The material of the substrate may for example be GaN, AlN, SiC, Si, diamond or sapphire, inter alia.

At least one of x' and y' may be different from z' or w', respectively, i.e. x' has a different value from z' and/or y' has a different value from w'. In other words, the material of the growth layer may be different from the material of the barrier layer.

The material of the channel layer is different from the material of the buffer layer, i.e. z has a different value from x and/or w has a different value from y.

The material of the barrier layer is different from the material of the channel layer, i.e. z' has a different value from z and/or w' has a different value from w.

Furthermore, the materials of the barrier and channel layers are chosen so as to allow a HEMT to be fabricated. The bandgap of the material of the barrier layer is wider than the bandgap of the material of the channel layer, and the electron affinity of the material of the barrier layer is lower than that of the material of the channel layer, so that a two-dimensional electron gas forms in the channel layer. The materials of the channel and barrier layers are thus chosen so as to cause electrons to accumulate at the interface between these two layers. The gate electrode may then form, with this barrier layer, a Schottky junction.

The materials of the buffer, channel and barrier layers may be undoped, or even be doped.

The structure may comprise one or more buffer layers, i.e., as is known per se, the buffer thickness may be a multilayer. Likewise, the structure may comprise one or more channel layers and one or more barrier layers.

The expressions "doped with germanium" and "germanium-doped" are understood to mean that the epitaxial material comprises a number of germanium atoms per cubic centimeter higher than or equal to $10^{18}$.

Advantageously and nonlimitingly, the masking layer may be completely removed from the location corresponding to this layer, or indeed be removed from only some of this location. This removal step may be carried out after the growth step d) and before the gate electrode is deposited.

In step c), the opening in the masking layer may be formed by removing the material of the masking layer by etching.

Advantageously and nonlimitingly, provision may be made to extend this opening so that the barrier layer has a smaller thickness, or a thickness of zero, in the location of the opening. In the latter case the portion of the barrier layer corresponding to this location is removed.

Advantageously and nonlimitingly, the process may comprise an etching step, before the epitaxial growth step d), in order to remove the material in the location of the opening formed in the masking layer, so as to remove the portion of the barrier layer corresponding to this location.

Locally removing the barrier layer prevents the electrons that form the source-drain current from having to overcome the potential barrier corresponding to the barrier layer, thus greatly decreasing, in the case of maximal positive biasing of the gate relative to the source, the drain-source voltage $V_{ds}$ required to make a source-drain current flow. This decreases the amount of heat dissipated in the transistor during its use, and therefore increases the power efficiency of amplifiers comprising such transistors. The fact that the barrier layer does not have to be overcome thus makes it possible to choose a barrier layer that is optimized to give a relatively low reverse Schottky leakage current, and a relatively strong electrostatic polarization, even when the thickness of the barrier layer is relatively small, for example about 1-10 nm, for example 4 nm. Because of this small thickness, intrinsic transconductance is relatively high, so that the cut-off frequency of the transistor may be relatively high. Because of the strong electrostatic polarization, the concentration of electrons in the channel layer is relatively high, thereby allowing a relatively high maximum current per unit length to be obtained for the transistor. Such a barrier layer having a high potential barrier and a strong electrostatic polarization may for example be formed from the material MN on a channel layer made of GaN, on a buffer layer with an elementary crystal cell size similar to that of GaN.

Advantageously, provision may be made to extend this opening, for example by etching, so that the channel layer has a smaller thickness, or a thickness of zero, in the location of the opening. The etching step may for example be carried out so as to extend the opening formed in step c) as far as the channel layer, for example by decreasing the thickness of the channel layer in this location (i.e. the opening is defined in the channel layer) or even by removing the portion of the channel layer corresponding to this location (i.e. the opening passes through the channel layer in order to reach the buffer layer or the substrate).

The epitaxial material may be doped only with germanium, or indeed furthermore comprise other dopant atoms, for example silicon atoms, the number of atoms per cubic centimeter of all these other dopants being lower than or equal to the number of atoms per cubic centimeter of germanium. In other words, germanium represents at least 50% by number of the dopants, advantageously at least 80% and advantageously close to 100%.

Advantageously and nonlimitingly, the process may include a prior isolation step in order to make a zone around the transistor non-conductive. In this way it is ensured that, during operation of the transistor, the electrons flowing between the source and drain indeed pass through the channel layer controlled by the gate voltage. Conventional methods, for example etching of the active layers or ion implantation, will possibly be employed. This is conventional for any field-effect transistor and known to those skilled in the art.

Advantageously and nonlimitingly, in step d) provision may be made to employ a metalorganic vapour phase epitaxy (MOVPE) technique, or even a metalorganic chemical vapour deposition (MOCVD) technique. This technique may be relatively advantageous in so far as the process may then be relatively easy to industrialize.

Of course, the invention is not limited by the choice of the epitaxy technique employed in step d). Provision will for example possibly be made to employ a molecular beam epitaxy (MBE) technique or any other technique allowing a III-V material to be grown by epitaxy, the atoms from column V of the periodic table being nitrogen atoms, and the atoms from column III of this table being chosen from gallium, aluminium and indium.

Advantageously and nonlimitingly, in step e) a plurality of metal layers are deposited, for example:
  a tie layer, for example of titanium, deposited on the epitaxial material;
  a barrier layer, for example of platinum, deposited on the tie layer; and
  a conduction layer, for example of gold, deposited on the barrier layer.

Alternatively, the contact electrode may be formed from a single layer, for example of tungsten.

Advantageously and nonlimitingly, step e) of depositing the contact electrode may be carried out without an alloying anneal.

This contact electrode may comprise a source electrode.

In this step, provision may be made to furthermore deposit a drain electrode.

Furthermore, a heterojunction field-effect transistor is provided comprising a semiconductor structure made up of superposed layers, comprising in the stacking order on a substrate:
  a buffer layer composed of a semiconductor material having a hexagonal crystal structure, namely $Ga_{(1-x-y)}Al_{(x)}In_{(y)}N$, where x and y are comprised between 0 inclusive and 1 inclusive, the sum x+y being lower than or equal to 1;
  a channel layer, this channel layer being composed of a material having a hexagonal crystal structure, namely $Ga_{(1-z-w)}Al_{(z)}In_{(w)}N$, where z and w may be comprised between 0 inclusive and 1 inclusive, the sum z+w being lower than or equal to 1, z being different from x and/or w being different from y; and
  a barrier layer, this barrier layer being composed of a material having a hexagonal crystal structure, namely $Ga_{(1-z'-w')}Al_{(z')}In_{(w')}N$, where z' and w' may be comprised between 0 inclusive and 1 inclusive, the sum z'+w' being lower than or equal to 1, z' being different from z and/or w' being different from w;
  a layer of growth material (what is called the epitaxial layer), deposited by high-temperature epitaxy on a growth zone corresponding to the location of an opening formed in a dielectric masking layer, this growth material being composed of $Ga_{(1-x'-y')}Al_{(x')}In_{(y')}N$ doped with germanium and having a hexagonal crystal structure, where x' and y' are comprised between 0 inclusive and 1 inclusive, the sum x'+y' being lower than or equal to 1; and
  a, source or drain, contact electrode on the layer of growth material and a gate electrode in a location outside of the growth zone.

The edges of the layer of growth material of this HEMT may be relatively sharply defined. In particular, these edges may have an inclination relative to the vertical, which may be between 5° and 60° and is typically about 45°.

Furthermore, an integrated circuit is provided, comprising a transistor such as described above.

This circuit may be a monolithic microwave integrated circuit (MMIC), inter alia.

In the present patent application, the term on is both understood to mean "directly on" and "indirectly on", i.e. a layer deposited on another may make contact with this other layer, or indeed be separated therefrom by one or more intermediate layers.

BRIEF DESCRIPTION OF THE DRAWINGS

The invention will be better understood with reference to the figures, which illustrate nonlimiting embodiments given by way of example.

FIGS. 1 to 5 are very schematic cross-sectional views of one example transistor during fabrication, according to one example process according to one embodiment of the invention.

DETAILED DESCRIPTION OF THE PREFERRED EMBODIMENTS

Identical references will be used from one figure to another to designate identical or similar elements.

Figure 1:
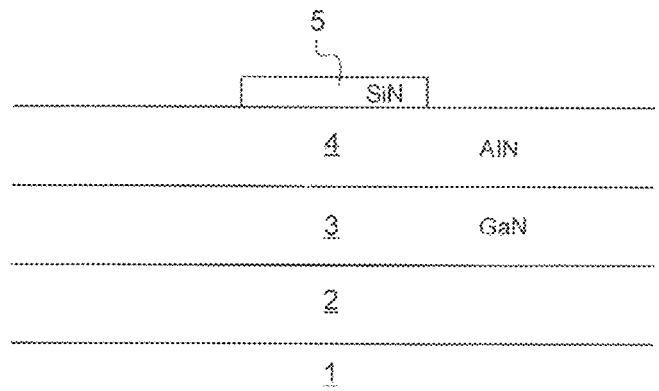

With reference to FIG. 1, provision is made to superpose, on a substrate 1 for example composed of silicon, semiconductor layers having hexagonal crystal structures, said layers being composed of III-V materials, the atoms from column V of the periodic table being nitrogen atoms, and the atoms from column III of this table being chosen from gallium, aluminium and indium.

This superposition comprises:
  a buffer layer 2, for example composed of undoped $Ga_{0.9}Al_{0.1}N$;
  a channel layer 3, for example composed of undoped GaN;
  a barrier layer 4, for example composed of undoped MN; and
  a dielectric masking layer 5, for example composed of SiN.

In FIG. 1, an etching step, carried out in a way known per se and involving an additional masking layer (not shown because removed after the etching), was used to form openings in the masking layer 5, so that there only remains a central portion of this layer 5.

Figure 2:
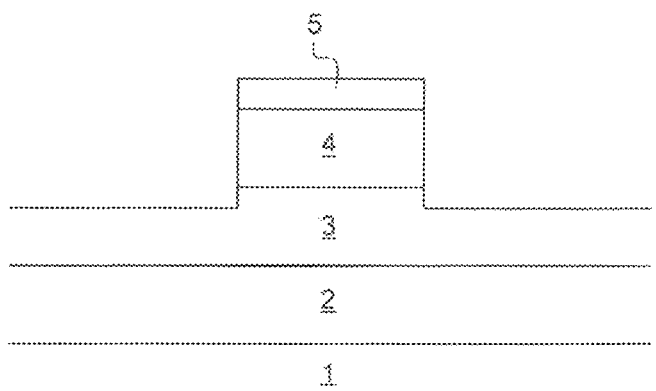

With reference to FIG. 2, an etching step, carried out in a way known per se, is used to remove material level with the openings formed in the masking layer 5, so as to remove the portion of the barrier layer 4 corresponding to these locations. Thus only the portion of the barrier layer 4 corresponding to the location of the central portion of the layer 5 is retained. The openings thus defined now extend thicknesswise as far as the channel layer 3.

Figure 3:
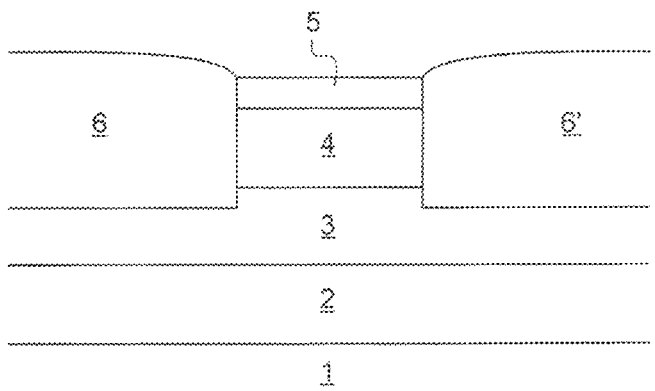

With reference to FIG. 3, germanium-doped growth material 6, 6' is grown using an MOVPE technique in the locations corresponding to the openings in the masking layer 5. The growth material has a hexagonal crystal structure and is composed of GaN doped $N^+$ with germanium.

The choice of germanium allows relatively sharply defined interfaces to be obtained between the portions, 6, 6' and 5.

This step is carried out at a high temperature, so as to obtain substantial mass transport. The seeds may for example be liable to migrate over distances of about 10 μm. In so far as the distance between drain and source locations is in general smaller than one μm, it will be understood that selectivity is ensured. The material of seeds that would otherwise have formed on the layer 5 is thus transported by diffusion over the surface of the layer 5 toward the layers 6 and 6', where incorporation is thermodynamically more favourable. This high-temperature process makes it possible to limit, and advantageously prevent, the formation of seeds on the surface of the layer 5.

Since the growth material is doped with germanium, the mechanical stresses are lower than with a Si-doped material, and the morphology problems liable to be encountered in the case of silicon doping are not observed. The thickness of the growth layers 6, 6' is relatively uniform over the entire wafer. The edges of the zones 6, 6' are relatively clearly defined. Reproducibility is also satisfactory.

A high doping of these localized epitaxial zones 6, 6' is advantageous as this makes it possible to avoid the need for alloying to produce a good ohmic contact having a low contact resistance with the electrodes, and the improvement in and better control of the morphology therefore allows dimensions to be even further decreased.

To do this, the following conditions will possibly be implemented in the localized epitaxy step:
vector gas: $H_2$ and/or $N_2$ and/or another inert gas;
temperature between 700 and 1150° C. and advantageously between 1000° and 1150° C.;
reactants: trimethylgallium (and/or other Ga organometallics) and $NH_3$ (and/or other N-providing molecules, such as hydrazine, amines, etc.);
dopant gas: $GeH_4$ (and/or organo-germanium compounds or halogenides of germanium).

The proportions of the reactants and dopants are chosen so as to obtain a material containing $10^{18}$ germanium atoms per cubic centimeter or more, for example $10^{20}$ or $10^{21}$ germanium atoms per cubic centimeter.

Next, as is known per se, contacts 15, 16 are deposited on these layers of growth material 6, 6'. More precisely, each contact 15, 16 comprises:
a tie layer 7, 10, for example a layer of titanium, deposited on the epitaxial material;
a barrier layer 8, 11, for example a layer of platinum, deposited on the corresponding tie layer 7, 10; and
a conduction layer 9, 12, for example a layer of gold, deposited on the corresponding barrier layer 8, 11.

It may be noted that the source and drain contacts 15, 16 are deposited without an anneal.

Next, with reference to FIG. 5, one portion of the masking layer 5 is etched so that only two portions 5A, 5B of this masking layer SiN remain, and in the new opening thus defined a metal gate contact 13 is deposited.

Alternatively, provision could of course be made to remove completely the masking layer 5 before depositing the gate contact.

Again alternatively, it is also possible to leave all or some of the SiN masking layer 5 in place, and to deposit the gate electrode thereon.

As is known per se, this gate contact may also be made up of a plurality of layers (tie, barrier and conduction layers), not shown. For example, provision could be made for a nickel tie layer and a gold conduction layer.

The transistor thus obtained may contain germanium-doped portions 6, 6' of relatively high quality.

The materials of the channel and barrier layers 3, 4 are chosen so as to form a two-dimensional electron gas, represented in FIG. 5 by the zone referenced 14. Doping the layers 6, 6' with germanium allows a relatively sharply defined junction to be obtained between the layers 6, 3, 4 and 6', 3, 4, which contributes to improving the performance of the transistor.

This transistor may allow a MMIC circuit having a higher performance to be produced.

Figure 6:
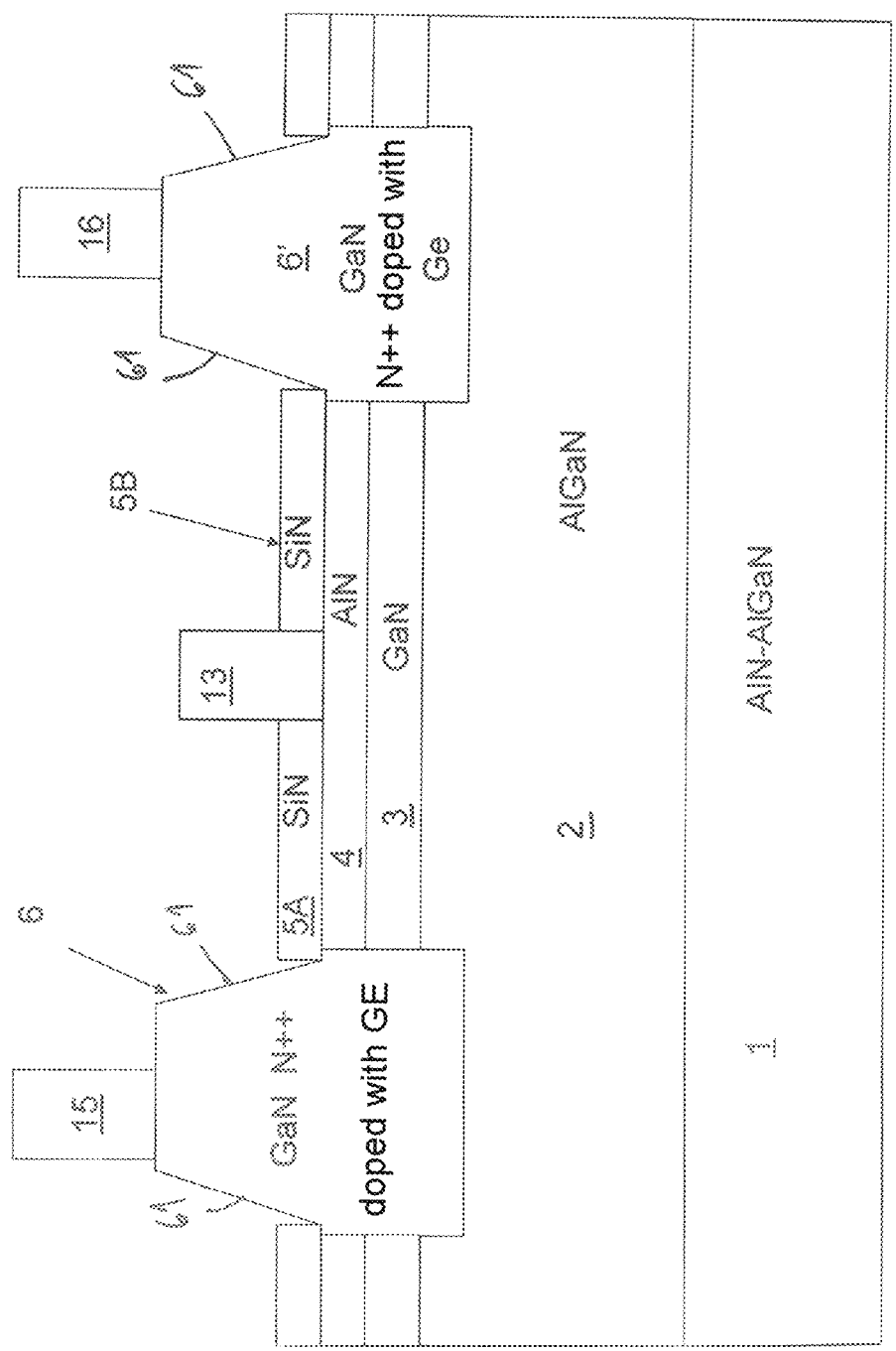
FIG. 6 is a very schematic cross-sectional view of an example transistor according to one embodiment of the invention.

With reference to FIG. 6, the HEMT shown was obtained by etching the material corresponding to the locations defined by the dielectric masking layer corresponding to the reference 5 in FIGS. 1 to 4 under conditions such that the opening thus defined extends as far as the buffer layer 2. In other words, said opening extends through the channel layer 3.

The epitaxial growth material is then deposited at high temperature.

As has been expressly shown in this Figure, the growth layers 6, 6' thus obtained have slightly oblique walls 61 that are set back relative to the masking layer.

The layers 6, 6' may have a thickness such that they extend heightwise beyond the masking layer, without running the risk of covering the latter.

It is thus possible to choose to deposit, at the start of the process, a relatively thin masking layer.

The invention claimed is:
1. A heterojunction field-effect transistor comprising:
a semiconductor structure made up of superposed layers, comprising in a stacking order on a substrate layer:
a buffer layer composed of a material having a hexagonal crystal structure of $Ga_{(1-x-y)}Al_{(x)}In_{(y)}N$, where x and y are comprised between 0 inclusive and 1 inclusive, the sum x+y being lower than or equal to 1,
a channel layer on the buffer layer, the channel layer being composed of a material having a hexagonal crystal structure of $Ga_{(1-z-w)}Al_{(z)}In_{(w)}N$, where z and w are comprised between 0 inclusive and 1 inclusive, the sum z+w being lower than or equal to 1, at least one of z and w being different from x or y, respectively, and
a barrier layer on the channel layer, the barrier layer being composed of a material having a hexagonal crystal structure of $Ga_{(1-z'-w')}Al_{(z')}In_{(w')}N$, where z' and w' are comprised between 0 inclusive and 1 inclusive, the sum z'+w' being lower than or equal to 1, at least one of z' and w' being different from z or w, respectively,
a layer of epitaxial material, deposited by epitaxy on a growth zone corresponding to the location of an opening formed in a dielectric masking layer, the growth material having a hexagonal crystal structure and being composed of $Ga_{(1-x'-y')}Al_{(x')}In_{(y')}N$ and previously-doped with germanium, where x' and y' are comprised between 0 inclusive and 1 inclusive, the sum x'+y' being lower than or equal to 1, at a temperature sufficient for constituent atoms of the semiconductor material having the hexagonal crystal structure of $Ga_{(1-x'-y')}Al_{(x')}In_{(y')}N$ doped with germanium to migrate toward the growth zone, by mass transport, and
a contact electrode on the layer of growth material and a gate electrode in a location outside of the growth zone,
wherein the material doped with germanium has a sufficiently defined crystal structure for lateral edges of the growth layer to have an inclination between 5° and 60° relative to the vertical.
2. A monolithic microwave integrated circuit comprising:
a heterojunction field-effect transistor comprising:
a semiconductor structure made up of superposed layers, comprising in a stacking order on a substrate layer:
a buffer layer composed of a material having a hexagonal crystal structure of $Ga_{(1-x-y)}Al_{(x)}In_{(y)}N$, where x and y are comprised between 0 inclusive and 1 inclusive, the sum x+y being lower than or equal to 1, a channel layer on the buffer layer, the channel layer being composed of a material having a hexagonal crystal structure of $Ga_{(1-z-w)}Al_{(z)}In_{(w)}N$, where z and w are comprised between 0 inclusive and 1 inclusive, the sum z+w being lower than or equal to 1, at least one of z and w being different from x or y, respectively, and a barrier layer on the channel layer, the barrier layer being composed of a material having a hexagonal crystal structure of $Ga_{(1-z'-w')}Al_{(z')}In_{(w')}N$, where z' and w' are comprised between 0 inclusive and 1 inclusive, the sum z'+w' being lower than or equal to 1, at least one of z' and w' being different from z or w, respectively, a layer of epitaxial material, deposited by epitaxy on a growth zone corresponding to the location of an opening formed in a dielectric masking layer, the growth material having a hexagonal crystal structure and being composed of $Ga_{(1-x'-y')}Al_{(x')}In_{(y')}N$ and previously-doped with germanium, where x' and y' are comprised between 0 inclusive and 1 inclusive, the sum x'+y' being lower than or equal to 1, at a temperature sufficient for constituent atoms of the semiconductor material having the hexagonal crystal structure of $Ga_{(1-x'-y')}Al_{(x')}In_{(y')}N$ doped with germanium to migrate toward the growth zone, by mass transport, and a contact electrode on the layer of growth material and a gate electrode in a location outside of the growth zone, wherein the material doped with germanium has a sufficiently defined crystal structure for lateral edges of the growth layer to have an inclination between 5° and 60° relative to the vertical.

3. A process for fabricating a heterojunction field-effect transistor comprising a semiconductor structure made up of superposed layers, the process comprising:

a) providing on a substrate layer:
- a buffer layer composed of a semiconductor material having a hexagonal crystal structure of $Ga_{(1-x-y)}Al_{(x)}In_{(y)}N$, where x and y are comprised between 0 inclusive and 1 inclusive, the sum x+y being lower than or equal to 1,
- a channel layer on the buffer layer, the channel layer being composed of a material having a hexagonal crystal structure of $Ga_{(1-z-w)}Al_{(z)}In_{(w)}N$, where z and w are comprised between 0 inclusive and 1 inclusive, the sum z+w being lower than or equal to 1, at least one of z and w being different from x or y, respectively, and
- a barrier layer on the channel layer, the barrier layer being composed of a material having a hexagonal crystal structure of $Ga_{(1-z'-w')}Al_{(z')}In_{(w')}N$, where z' and w' are comprised between 0 inclusive and 1 inclusive, the sum z'+w' being lower than or equal to 1, at least one of z' and w' being different from z or w, respectively;

b) depositing a dielectric masking layer on the barrier layer;

c) forming an opening in the dielectric masking layer;

d) growing by epitaxy a semiconductor material having a hexagonal crystal structure of $Ga_{(1-x'-y')}Al_{(x')}In_{(y')}N$ and previously-doped with germanium, where x' and y' are comprised between 0 inclusive and 1 inclusive, the sum x'+y' being lower than or equal to 1, on a growth zone defined by the opening formed in the masking layer at a temperature sufficient for constituent atoms of the semiconductor material having the hexagonal crystal structure of $Ga_{(1-x'-y')}Al_{(x')}In_{(y')}N$ doped with germanium to migrate toward the growth zone, by mass transport;

e) depositing a source or drain contact electrode on the material thus deposited by epitaxy in step d); and f) depositing a gate electrode in a location outside of the growth zone.

4. The process according to claim 3 wherein
a metalorganic vapor phase epitaxy technique is employed in step d).

5. The process according to claim 4, wherein
the material deposited by epitaxy in step d) is germanium-doped GaN.

6. The process according to claim 5, wherein the step d) is carried out at a temperature higher than 960° C. and lower than or equal to 1150° C.

7. The process according to claim 4, wherein the step e) of depositing the contact electrode is carried out without an alloying anneal.

8. The process according to claim 7, wherein the step d) is carried out at a temperature higher than 960° C. and lower than or equal to 1150° C.

9. The process according to claim 4, wherein the step d) is carried out at a temperature higher than 960° C. and lower than or equal to 1150° C.

10. The process according to claim 3 wherein
a molecular beam epitaxy technique is employed in step d).

11. The process according to claim 10, wherein
the material deposited by epitaxy in step d) is germanium-doped GaN.

12. The process according to claim 11, wherein the step d) is carried out at a temperature higher than 960° C. and lower than or equal to 1150° C.

13. The process according to claim 10, wherein the step e) of depositing the contact electrode is carried out without an alloying anneal.

14. The process according to claim 10, wherein the step d) is carried out at a temperature higher than 960° C. and lower than or equal to 1150° C.

15. The process according to claim 3, wherein
the material deposited by epitaxy in step d) is germanium-doped GaN.

16. The process according to claim 15, wherein the step e) of depositing the contact electrode is carried out without an alloying anneal.

17. The process according to claim 15, wherein the step d) is carried out at a temperature higher than 960° C. and lower than or equal to 1150° C.

18. The process according to claim 3 wherein the step e) of depositing the contact electrode is carried out without an alloying anneal.

19. The process according to claim 18, wherein the step d) is carried out at a temperature higher than 960° C. and lower than or equal to 1150° C.

20. The process according to claim 3, wherein the step d) is carried out at a temperature higher than 960° C. and lower than or equal to 1150° C.

* * * * *